United States Patent [19]

Konrad et al.

[11] 4,234,840
[45] Nov. 18, 1980

[54] BATTERY STATE-OF-CHARGE INDICATOR

[75] Inventors: Charles E. Konrad, Roanoke; Richard K. Davis, Salem, both of Va.

[73] Assignee: General Electric Company, Salem, Va.

[21] Appl. No.: 29,941

[22] Filed: Apr. 13, 1979

Related U.S. Application Data

[63] Continuation of Ser. No. 862,796, Dec. 21, 1977, abandoned.

[51] Int. Cl.³ .......................... H02J 7/00; G08B 21/00
[52] U.S. Cl. ........................................ 320/48; 340/636
[58] Field of Search ............................ 320/39, 40, 48; 340/636; 324/433, 465

[56] References Cited

U.S. PATENT DOCUMENTS

| | | | |
|---|---|---|---|
| 3,307,101 | 2/1967 | Byles | 320/DIG. 1 |
| 3,932,797 | 1/1976 | York | 320/48 |
| 3,934,188 | 1/1976 | York | 320/48 |
| 3,979,657 | 9/1976 | Yorksie | 320/48 X |
| 4,021,718 | 5/1977 | Konrad | 324/465 X |
| 4,025,916 | 5/1977 | Arnold et al. | 340/636 |

Primary Examiner—Robert J. Hickey
Attorney, Agent, or Firm—Walter C. Bernkopf; Robert A. Cahill

[57] ABSTRACT

A circuit for indicating the charge state of a battery supplying discharge current to its load circuit under actual load operation during which battery discharge current is subject to magnitude variations and interruptions, having means for storing a stored signal whose value is representative of battery state-of-charge, means for rapidly increasing the value of the stored signal to the scaled value of the battery terminal voltage when its scaled value is below that of the battery terminal voltage, first means for decreasing the value of the stored signal at a slow rate preestablished such that the stored signal decreases from a first value representative of a fully charged battery to a second value representative of a discharged battery in a time period approximating the average time required during normal operation of the load circuit for the fully charged battery to become discharged, and second means, operative only during intervals when the battery supplies no discharge current to the load, for decreasing the value of the stored signal at a rate intermediate said slow and fast rates and related to the difference between the scaled values of the battery terminal voltage and the stored signal.

16 Claims, 5 Drawing Figures

BATTERY STATE-OF-CHARGE INDICATOR

This is a continuation of application Ser. No. 862,796, filed Dec. 21, 1977, now abandoned.

BACKGROUND OF THE INVENTION

The present invention relates to battery monitoring apparatus and more particularly to a battery state-of-charge indication system.

Storage batteries are used in numerous applications where it is important to know the amount of available energy remaining in the battery. For example, the battery state-of-charge is a critical parameter in the operation of battery energized electrically propelled traction vehicles, such as electric cars and forklift trucks. Such vehicles must rely upon the energy stored in the onboard batteries for propulsion, and the replenishing of stored energy requires special equipment which is only available at a charging station. Thus, means for indicating the energy state of the remaining battery charge can be advantageously used by the vehicle operator to ensure that the vehicle is returned to a charging station before the battery has been completely discharged. The vehicle batteries represent a substantial investment and the amortization of battery costs depends upon the available number of charge/discharge cycles and upon the average depth of discharge of a lead acid battery. It is well known that the life of a battery is reduced significantly when it is repeatedly discharged such that the specific gravity of the electrolyte falls below a specified quantity. Hence, it is desirable to provide some means for recognizing that the battery state-of-charge is approaching this level. Further, it is important that such a state-of-charge indicator system provide a continuous and an accurate state-of-charge output while the battery is connected to its normal load circuit and is operating under normal load conditions. For example, in the case of a battery energized vehicle, this permits the operator to perform his mission until the batteries have been discharged to a desired level.

Various types of prior art systems have been proposed for indicating the energy remaining in a battery or detecting a low battery condition under normal load operation including the following.

Specific gravity metering devices can detect a change in the index of refraction with variations in the specific gravity of the electrolyte. However, loads are commonly energized by plural batteries, each battery comprises a large number of cells and the electrolyte condition varies from cell to cell. This requires multiple sensors to obtain an average specific gravity. This results in unduly complex sensing circuits and means for interconnecting the sensors to the indicating system so as to permit normal battery exchanges. Further, the specific gravity of a cell may vary throughout the cell so that no one location is ideal as a sensing point.

Ampere hour and watt hour meter devices operate on the assumption that the remaining available energy corresponds to the energy input during charging minus the electrical energy which has been extracted. However, such systems fail to account for loss in the remaining available energy resulting from increased current discharge rates. For example, ampere hour meters commonly utilize a reversible electrochemical plating cell. During battery charging, this cell is plated with a material at a rate corresponding to the magnitude of the charging current so that total plating is the product of current and time. During discharge, the plating process is reversed in a similar fashion. However, the ampere hours (AH) available from a lead-acid battery depend upon the rate of discharge. Thus, a battery rated at 300 AH at a current drain which would deplete the charge in 6 hours may only provide 220 AH at a current corresponding to a one hour discharge rate so that the meter may indicate that one-third of the energy is available when, in fact, the battery is completed discharged. In addition, the instrument must remain with the batteries when batteries are exchanged for an alternate set at the charging station, since the meter cannot be reset for the unknown charging history of the new set. Further, such devices are subject to additional inaccuracies resulting from variations of recoverable AH based on battery age and temperature and variable battery charging efficiencies.

Arrangements have been proposed for indicating state-of-charge based on sensing the terminal voltage of batteries while energizing their load circuits. Commonly, a heavily dampled voltmeter is connected directly across the battery to provide an indication of battery charge. The battery voltage varies substantially with the changes of discharge current encountered during operation of loads such as the electric motors of traction vehicles. Thus, the meter produces variable and erroneous indications of battery charge. An electric vehicle operator may judge the battery charge condition by the magnitude of the voltage drop during a specific maneuver such as acceleration, i.e., a specific load. This requires a high level of skill and close observation by an operator who is likely to be preoccupied with vehicular operation.

Battery condition monitors utilizing a similar voltage detection prinicple have been employed in some battery powered industrial trucks. These devices have a voltage level switch activated when the battery terminal voltage drops below a preset level, e.g., 80–85% of nominal voltage. If the voltage remains below this level for a preset time interval, e.g. 15–30 seconds, an indicating lamp is energized and a second timer may be started. Upon the presence of the undervoltage condition over this second time interval, a specified work function of the vehile, such as the forklift, can thus be disabled so as to force the operator to return to the charging station. However, the sensing and detection means of such monitors are inexact and dependent upon may variables, including the changes in battery voltage with variations in load. In addition, no continuous indicating means is available to continuously advise the operator of the present state-of-charge and the low charge indication will often catch the operator by surprise.

Battery state-of-charge indicating systems relying on detection of battery terminal voltage during variations of load, i.e. discharge current, thus have tended to be inaccurate are unreliable. Improved results have resulted from a battery monitoring system providing an indication of the state-of-charge based on the differences between nominal battery voltage of a fully charged battery at a predetermined discharge current and the actual battery voltage occuring at the same predetermined discharge current level. A measure of battery voltage is stored when the predetermined value of discharge current occurs such that the stored value is updated solely during the occurrence of such predetermined value. Thus, the stored value provides a continuous indication of battery state-of-charge. This battery monitoring apparatus which is disclosed in my U.S. Pat.

No. 4,021,718, assigned to the assignee of the subject application, utilizes discharge current measuring means to produce a signal proportional to load, or discharge current. However, if such a current measuring device is not otherwise required for control of the battery load circuit, its requirement solely for use in battery state-of-charge monitoring increases the cost of the battery monitoring system which may limit its use in a highly competitive market.

OBJECT OF THE INVENTION

It is, therefore, an object of the invention to provide an improved method and apparatus for reliably providing the state-of-charge of a battery while energizing its load, including during intervals of varying discharge current.

It is a further object of the invention to provide such an improved method and apparatus which is operable without requiring sensing of discharge current magnitude.

It is another object of the invention to provide such apparatus for automatically providing a continuous state-of-charge indication substantially free of erratic indications or fluctuations caused by variations of discharge current.

SUMMARY OF THE INVENTION

These and other objects are attained in accordance with the invention by storing a value representative of battery terminal voltage, decreasing the stored value at a predetermined discharge rate which is independent of actual battery discharge current and when the scaled value of actual battery voltage exceeds the stored value increasing the stored value to the scaled value of such actual battery voltage at a rate substantially faster than said predetermined rate, such that the stored value is indicative of the battery voltage uner conditions of no-load and represents the battery state-of-charge. Preferably, the stored value is normally discharged at a predetermined low rate approximating the actual anticipated discharge rate of the battery, but during intervals of no battery discharge current, the value is discharged at a faster rate. This faster rate preferably decreases as a function of the decreasing difference between the value of actual battery voltage and of the stored value.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiment taken in conjunction with the accompanying drawings, in which:

DETAILED DESCRIPTION

Figure 1:
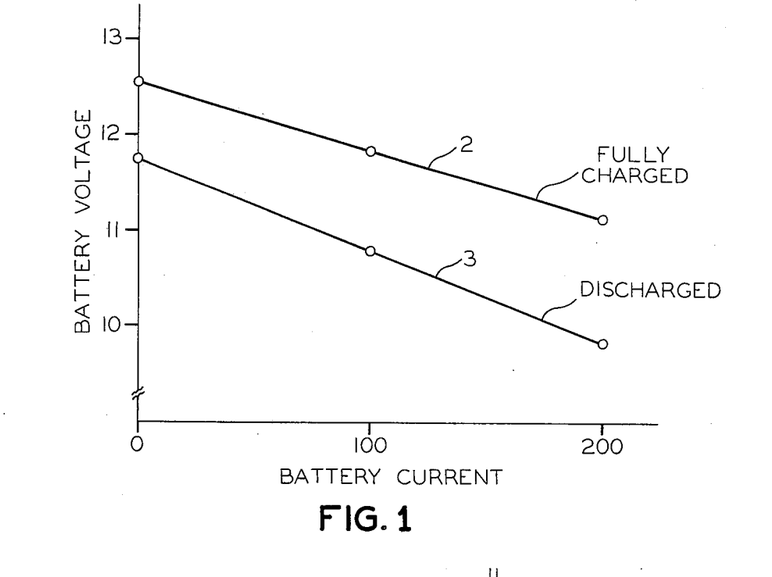
FIG. 1 is a representation of the relationship of battery terminal voltage and battery current at different levels of battery charge.

It is known that the terminal voltage of a lead acid storage battery which has been in a quiescent state for an extended period of time is a good indicator of the state-of-charge, for example, ranging from 2.12 volts per cell when fully charged to 1.97 volts per cell when substantially discharged. Thus, the state-of-charge of a battery which is disconnected from its load may be detected such as by a suppressed zero volt meter. However, the battery terminal voltage drops substantially under load, i.e. during the existence of discharged current. Further, after the discharge current terminates, the battery voltage rises only gradually to its true open circuit voltage. Thus, measuring the voltage of batteries under open circuit conditions does not provide an obvious solution to provide a state-of-charge indication of batteries while operating under varying load conditions. FIG. 1 illustrates the relationship between battery terminal voltage and battery current for different levels of battery charge. Lines 2 and 3 represent, respectively, fully charged and discharged load lines. Battery voltages and currents were measured under conditions of no-load, 100 amp discharge current, and 200 amperes of discharge current. These measurements were taken of one type of battery when (1) the battery was fully charged and (2) when it was discharged. The measured voltages for the fully charged battery are 12.55 volts at zero current, 11.73 volts at 100 amperes, and 11.15 volts at 200 amperes. The voltages for the discharged battery are 11.75 volts at zero current, 10.73 volts at 100 amperes, and 9.85 volts at 200 amperes. These voltage-ampere measurements are shown in FIG. 1 with a voltage-ampere characteristic line 2 for the fully charged battery and a voltage-ampere characteristic line 3 for the discharged battery. This demonstrates the inverse voltage to current relationship existing at a specified level of charge, e.g. fully charged and discharged. In the specific example the load lines for the charged and discharged battery are approximately linear and have relatively similar slopes. The fully charged battery has a significantly higher no-load voltage than the discharged battery. Accordingly the state-of-charge of the battery should be determinable from the battery terminal voltage existing at a specified load current level within the range normally encountered during operation including at zero current.

Figure 2:
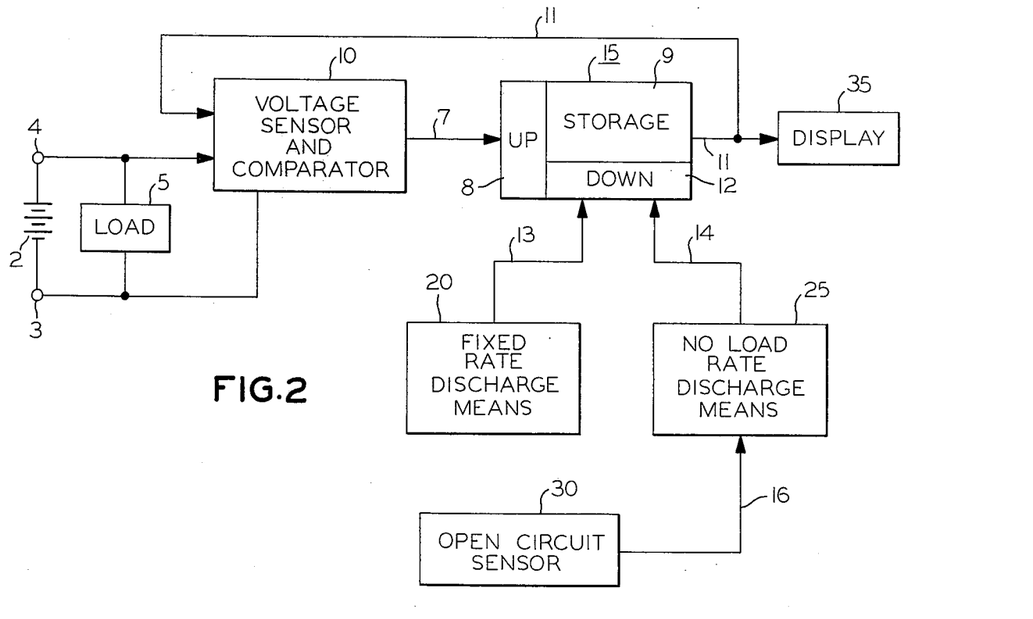
FIG. 2 is a block diagram of one embodiment of the invention.

Referring now to FIG. 2, there is shown a block diagram of a battery state-of-charge indicating circuit according to the present invention. A battery 2 having terminals 3 and 4 is connected in series circuit with its normal load 5. Terminals 3 and 4 are further connected to voltage sensor and comparator 10 whose output is connected via line 7 to storage device 15. The storage value output of this device is supplied by line 11 to display, or utilization, means 35 which provides an indication of the state-of-charge of the battery. Line 11 is additionally connected to an additional input of voltage sensor and comparator 10. Storage device 15 includes storage means 9 for storing a value representative of voltage, and "up" portion 8 which permits the stored value to be increased when the signal on line 7 is representative of a voltage value greater than the value stored, but does not permit the stored value to be decreased when the signal on line 7 has a value below the value stored. Device 15 further has a "down" portion 12 utilized solely for decreasing the stored value, as described subsequently. The arrangement desired above thus provides for storing a value which is representative of the battery voltage upon initial turn-on of the system, and for rapidly increasing this stored value whenever the stored value diminishes below a value representative of actual battery voltage, such that the stored value is increased to represent the actual value of the battery voltage.

As the battery is discharged, its terminal voltage decreases. It is therefore necessary to reduce the stored value. This is accomplished by fixed rate discharge means 20 whose output is connected by line 13 to the "down" portion 12 of discharge means 15. The discharge means 20 thus causes the value stored in storage means 9 to be reduced at a predetermined rate. Since the state-of-charge indicating system does not utilize a current sensor and the true discharge rate is thus not detected, the stored value must be reduced at an approximated rate. The discharge rate of discharge means 20 is thus selected to approximately track the reduction of no-load battery terminal voltage resulting from discharge currents. Discharge means 20 causes the stored value to be reduced at a predetermined rate which corresponds to the average of the anticipated discharge rate occurring during normal operation of the load. This anticipated discharge rate is inversely proportional to the time required for the battery to discharge from its fully charged to its discharged state. This depends upon the batteries utilized, the type of load system, and the normal type of operation of the load. For example, an industrial utility vechile such as a forklift truck, may have a battery discharge time of 3 hours, i.e. a fully charged battery will be discharged after 3 hours of vehicle operation. This time constant varies with operating parameters. A heavier on the road vehicle operating at maximum speed, e.g. 45 miles per hour, may have a battery discharge time of about one hour. The time constant of normal types of electric vehicle systems therefore is believed to at least exceed 30 minutes and may range upward to many hours.

The above referenced predetermined discharge rate thus is a function of the difference of the stored value representative of a fully charged battery and the value representative of a discharged battery divided by the above referenced time constant. Further discussion of this topic follows in connection with the description of FIG. 4. The stored value is prevented from decreasing below the value representative of actual battery voltage, by the above-described arrangement for rapidly increasing the stored value to value representative of actual battery voltage.

However, if the actual battery discharge rate exceeds the predetermined rate of discharge, the battery can be discharged while the stored value still indicates that substantial energy remains in the battery. One solution to this problem is to increase the predetermined discharge rate of means 20, such that the stored value is decreased more rapidly than the maximum battery discharge rate. During operation of a typical load circuit, such as for example a forklift truck, there typically are long intervals during which the battery is discharged followed by briefer time intervals when the battery is unloaded. During these no-load intervals, the battery voltage increases from its load voltage to its true no-load voltage. Under conditions where the predetermined discharge rate exceeds the actual discharge rate, the actual battery voltage will exceed the stored value when the battery is unloaded. This causes the stored value to increase when the load is removed for any substantial time. This is likely to lead to considerable wandering of the stored value output and thus to wandering of the output of indicating means 35. Accordingly, in a preferred embodiment of the invention, a more stable indication of charge is attained by adjusting the fixed rate to the typical discharge rate and by adding a second discharge means for reducing the stored value during intervals when the battery does not provide a discharge current. This is accomplished by no-load rate discharge means 25 whose output is connected by line 14 to the "down" portion 12 of storage means 15. Discharge means 25 is activated solely during conditions of battery open circuit by means of open circuit sensor 30 which is shown connected by line 16 to discharge means 25. Sensor 30 may be a device responding to circuit contactors which open the battery circuit. Alternatively, other types of open circuit sensor means may be utilized. For example, it has been found that electric motors upon being energized by the battery produce a commutator ripple which can be detected by a squelch circuit which circuit can be utilized to inhibit the discharge means 25 during periods when the motor is energized. In summary, the value of battery voltage is initially stored in storage device 15. As the battery is discharged, its state-of-charge and its true no-load battery voltage is reduced. Thus, the value representative of actual battery voltage decreases below the stored value. Accordingly, during periods when the battery-load system is energized, the stored value is continuously discharged at a predetermined rate, which preferably corresponds to a typical average discharge rate. This is accomplished by discharge means 20 acting on storage device 15. If the value stored in storage device 15 is reduced below the value of the actual battery terminal voltage, the stored value is rapidly increased, at a rate substantially faster than the discharge rate of means 20, to a value corresponding to actual battery voltage. This is accomplished by comparison of actual battery voltage and stored value by comparator 10 which supplies to the "up" portion 8 of storage device 15 an input causing the stored value to be increased to the value representative of the battery voltage.

Figure 3:
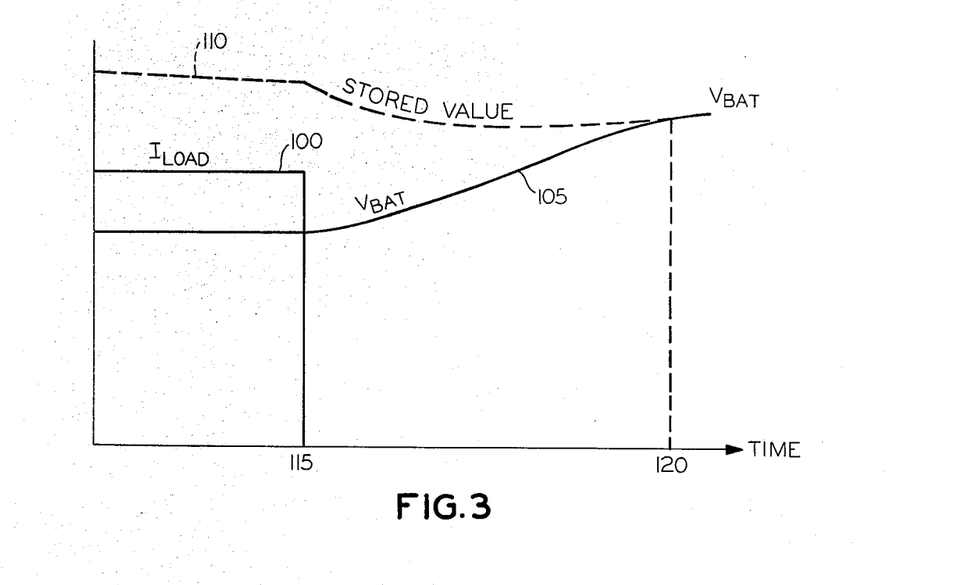
FIG. 3 is a graphic representation of the relationship of actual battery voltage and of the value of battery voltage as stored in respect to time.

FIG. 3 illustrates operation of the system, including the no-load rate discharge means 25. FIG. 3 illustrates the relationship between the actual battery voltage, as represented by line 105, and the stored value, as represented by line 110, as a function of time. It is assumed that the value initially stored in storage means 15 was representative of a no-load voltage of the battery. Subsequently, the battery is discharged during a time interval, represented extending to 115, when there is discharge, or load, current 100 of unknown magnitude. During this interval, fixed rate discharge means 20 causes the stored value to be decreased at a slow rate, as indicated by the dashed line segment 110 extending to the time identified at 115. During this interval, the battery voltage is below the value of the stored value, since battery voltage varies inversely with the magnitude of discharge current. Upon termination of discharge current at time 115, the battery voltage gradually rises to its true open circuit voltage. For one type of lead acid battery, the time constant of this recovery appeared to be approximately 5 minutes. Upon termination of load current at time 115, open circuit sensor 30 activates no-load rate discharge means 25. The net effect of discharge means 25 and 20 is to increase the rate at which the stored value is reduced, as indicated by the segment of line 110 subsequent to time 115. This net discharge rate is approximately matched to the recuperation time constant of the battery. The most accurate indication of state-of-charge is achieved by adjusting this net rate of stored value reduction in proportion to the difference between battery terminal voltage and the stored value, i.e. an exponential rate. This is illustrated by the portion of stored value line segment 110 subsequent to time 115. At time 120, the stored value and the actual battery voltage value intersect. At this point, the stored value is updated to the actual battery voltage to prevent the stored value from declining below the actual battery voltage value. The preferred embodiment of the system thus provides a state-of-charge indication essentially based on the magnitude of actual battery voltage occurring when there is no-load current. Thus, the stored value is rapidly increased to a value representative of actual battery voltage at a first, rapid, rate. It is decreased slowly at a second rate approximating average battery discharge during the occurrence of discharge currents, and it is decreased at a somewhat higher, third rate, intermediate the first and second rates, subsequent to the termination of discharge current until the value representative of battery voltage corresponds to the stored value.

Figure 4:
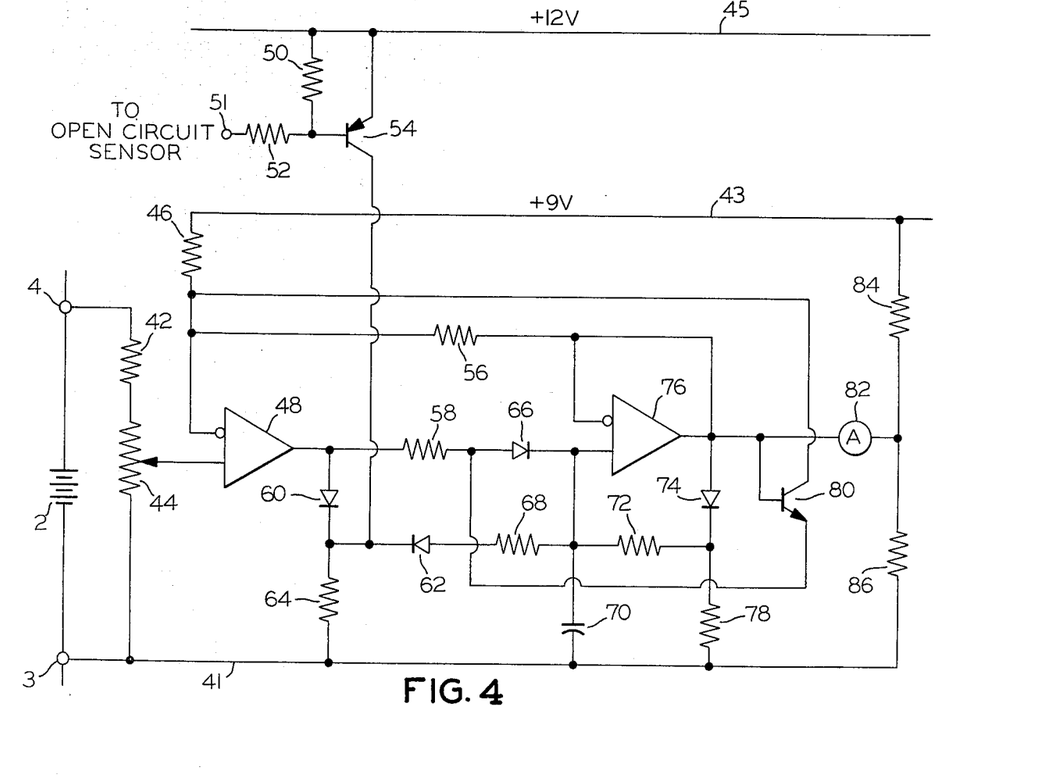
FIG. 4 is a schematic drawing of the embodiment of FIG. 2.

Referring now to FIG. 4, there is shown a schematic of a preferred embodiment of the invention. Negative terminal 3 of battery 2 is connected to a common bus 41 and positive terminal 4 is connected in series circuit through resistor 42 and potentiometer 44 to the common bus. The arm of the potentiometer is connected to the non-inverting input of operational amplifier 48. The arm of potentiometer 44 is adjusted to have a first predetermined voltage, e.g. 9 volts, when battery 2 is fully charged and a second predetermined voltage, e.g. 8.33 volts, when the battery is substantially discharged. Capacitor 70, which constitutes the storage means, is connected between the common bus 41 and via serially connected diode 66 and resistor 58 to the output of amplifier 48. The junction of diode 66 and of capacitor 70 is connected to the non-inverting input of operational amplifier 76 whose output is connected to its inverting input. Amplifier 76 thus is connected as a voltage follower to provide at its output an indication representative of the charge on capacitor 70 without materially affecting the stored value. The output of amplifier 76 is also connected via resistor 56 to the inverting input of operational amplifier 48. This inverting input is additionally connected through resistor 46 to a first positive bus 43 having a first predetermined positive potential, e.g. +9 volts. Operational amplifier 48 thus operates as a comparator, comparing the scaled voltage of capacitor 70 with the voltage on the arm of potentiometer 44 which represents a scaled down level of battery terminal voltage. This comparison circuit provides for increasing the stored value in the manner previously described. Specifically, if the capacitor voltage is below the voltage on the potentiometer arm, the output of comparator-amplifier 48 is switched to a high level so as to charge capacitor 70 through the series circuit comprising resistor 58 and diode 66. Once the voltage of capacitor 70 exceeds the potentiometer arm value by an incremental amount, the scaled voltage output of amplifier 76, applied to the inverting input of comparator 48, will exceed the potential on potentiometer arm 44, causing the output of comparator 48 to switch to a low level. However, capacitor 70 is prevented from discharging into the low level output of comparator 48 by diode 66, whose cathode is connected to the positively charged side of the capacitor. The described arrangement thus constitutes a peak detector circuit for charging storage capacitor 70 whenever a scaled value of actual battery voltage exceeds the value stored on the capacitor, such that the capacitor is charged to a value representing the actual battery voltage.

The following is a description of the fixed rate discharge system. Discharge of capacitor 70 at the fixed rated is accomplished by the network comprising diode 74 and resistors 72 and 78. Diode 74 and resistor 78 are serially connected between the output of amplifier 76 and common bus 41 with the anode of doide 74 being connected to the amplifier output. Capacitor 70, which is connected to the non-inverting input of amplifier 48 has a residual charge. Since amplifier 76 is connected as a voltage follower, its output will be at the same potential as its non-inverting input. The output potential is sufficiently positive, e.g. +3 volts, in respect to the common bus to cause conduction through diode 74 and resistor 78. During conduction, the diode has a predetermined and reasonably constant small voltage drop, e.g. 0.5 volts. Resistor 72 is connected between the cathode of diode 74 and the junction of capacitor 70 and the non-inverting input of amplifier 76. As previously stated, the potentials at the non-inverting input and the output are identical, and there is a predetermined constant voltage drop across diode 74. Therefore, resistor 72 has a constant potential across its terminals which equals the drop across diode 74. For example, with a diode potential of 0.5 volts, the potential drop across resistor 72 is also 0.5 volts. Thus there is a constant discharge current flow through resistor 72 whose fixed magnitude is equal to the potential drop, e.g. 0.5 volts, divided by the resistance of resistor 72. The magnitude of discharge current, $I_{72}$, is: $I_{72}$=(Capacitance of 72)($\Delta V$)/$\Delta T$ where $\Delta V$ equals the difference between the voltage of capacitor 72 when fully charged and when discharged, and $\Delta T$ equals the battery discharge time constant in seconds, i.e. the anticipated time for the battery to discharge from full load under the assumed operating conditions. In one case, for example, the circuit parameters were selected such that the capacitor has a capacitor of 10 $\mu$fd, the capacitor voltage, i.e. the voltage at the non-inverting input of amplifier 76, was 9 volts for a fully charged battery and 3 volts for a discharged battery. According, $\Delta V$ equals $9-3=6$ volts. The battery discharge time constant for a vehicle having particularly high discharge requirements because of its anticipated continuous high speed operation, was 44 minutes, i.e. 2643 seconds. Thus, the discharge current was $(10\times 10^{-6})$ $(6)/2643=2.27\times 10^{-8}$ amps. The resistance of resistor 72 equals the voltage of diode 74, e.g. 0.5 volts, divided by the discharge current, and for the above example was $22\times 10^6$ ohms.

It should be noted that the storage capacitor being interposed between operational amplifiers is not subject to random and undesired discharge circuits which otherwise could substantially reduce the predetermined rate of discharge. The input, i.e. offset, current of operational amplifier 76 was limited to a very small percentage of the current through resistors 72. Of course, other circuits could be utilized to assure that the capacitor is discharged at the predetermined rate.

The no-load rate discharge system is described below. Diode 60 and resistor 64 are serially connected from the output of comparator 48 to the common bus 41. Resistor 68 and diode 62 are connected in series circuit from the junction of storage capacitor 70 and the non-inverting input of amplifier 76 to the junction of diode 60 and resistor 64. The series of combination of resistor 68 and diode 62 provides the discharge path of the no-load rate discharge circuit. The junction of diodes 60 and 62 is connected to the collector of transistor 54 whose emitter is connected to a second positive bus 45, e.g. +12 volts. The base of transistor 54 is connected through resistor 50 to bus 45 and through resistor 52 to terminal 51. As further described, terminal 51 is connected to an open circuit sensor whose output is indicative of the presence or absence of battery discharge current. In the described embodiment, an open circuit detector, for example of the type illustrated in FIG. 5, clamps the base of transistor 54 to zero volts during intervals when the battery supplies a discharge current. Transistor 54 having its emitter connected to positive bus 45 thus conducts and applies a positive voltage to the cathodes of diodes 60 and 62. This application of reverse bias to the diodes blocks conduction through resistor 68 and diode 62 and thus disables operation of the no-load rate discharge circuit during intervals of battery discharge current.

During intervals when there is no battery discharge current, the open circuit sensor output coupled to resistor 52 is not clamped to zero volts. Accordingly, resistor 50 applies a positive potential to the base of transistor 54 causing the transistor to be cut off. This removes the positive back bias signal otherwise supplied from the emitter of transistor 54 to the junction of diodes 60 and 62. This permits the no-load rate discharge circuit to operate while the scaled voltage on storage capacitor 70 exceeds the voltage on the arm of potentiometer 44, i.e. the scaled value representative of battery terminal voltage. The circuit additionally includes transistor 80 whose emitter is connected to the junction of resistor 58 and diode 66, whose collector is connected to the inverting input of comparator 48, and whose base is connected to the output of operational amplifier 76. When there is no battery discharge current, and when the stored value, i.e. scaled voltage, on capacitor 70 exceeds the voltage on the potentiometer arm, the output of comparator 48 becomes less positive, i.e. moves in a negative direction, so as to forward bias the emitter base junction of transistor 80. This causes transistor 80 to conduct, effectively connecting resistor 58 between the output and inverting input of comparator 48. Thus, operational amplifier 48 operates essentially as a voltage follower and provides at its output a signal representative of the voltage on the arm of potentiometer 44. Accordingly, voltage across resistor 68 is proportional to the difference between the stored value on capacitor 70 and the value representative of actual battery voltage. Hence, the "no-load" discharge current through resistor 68 is proportional to the difference between this stored value and actual value, and accordingly decreases as the difference between the stored value and the actual value decreases. In a preferred embodiment, the resistance of resistor 68 was selected to be 10 M. With the potential drops encountered, this provided a substantially faster discharge rate than the discharge rate produced by "fixed rate" resistor 72. The net discharge rate under no-load conditions was, in this case, selected to be about 5 minutes, so as to approximate the time required for a lead acid storage battery to recover to its true no-load value after the cessation of discharge current.

The output voltage of amplifier 76 is representative of the charge on storage capacitor 70 and thus is indicative of the state-of-charge of the battery. The voltage ranges from a first predetermined voltage, e.g. 9 volts, for a fully charged battery to a lower second predetermined voltage, e.g. 3 volts, for a discharged battery. Various known types of display or utilization circuits can thus be employed. The preferred embodiment merely provides an analog meter representation. A voltage divider comprising resistors 84 and 86 is connected from the positive bus 43 to common bus 41. An ammeter 82 is connected between the output of amplifier 76 and the junction of resistors 84 and 86. For the specific arrangement where the bus 43 voltage is +9 volts, and the amplifier 76 output ranged from 9 volts for a fully charged battery to 3 volts for a discharged battery, the resistance of resistor 84 is twice that of resistor 86 providing 3 volts at their junction, and the resistance of resistor 86 was further chosen such that the ratio of 9 volts, i.e. the amplifier 76 output for a fully charged battery, to the resistance of resistor 86 provides full scale deflection of the ammeter.

The following components were utilized in a preferred embodiment of the invention:
 Amplifier 48—Type TL 082, Texas Instruments
 Amplifier 76—Type LM 239, National Semiconductor
 Resistors: 46—10K; 56—80K; 58—56K; 64—10K; 68—10M; 72—22M; 78—10K; 84—20K; 86—10K.
 Capacitor 70—10 μfd
 Transistors: 54—Type 2N4249; 80—Type 2N2714
 Diode: 60—Type 1N457A; 62—Type 1N457A; 74—Type 1N457A Various alternative circuit embodiments can be utilized in lieu of that illustrated in FIG. 4. These can be analog or digital circuits. For example, a digital system of the type illustrated in FIG. 2 can utilize a counter in lieu of a storage capacitor for storage element 15. In such an arrangement, the output of the comparator 10 would operate into the count up terminal of the counter. The counter output can, for example, be converted to an analog output. The current magnitude of the discharge means can be converted to digital pulses applied to a countdown terminal of the counter. Such arrangements are known in the prior art. For example, the referenced U.S. Pat. No. 4,021,718 discloses arrangements for decreasing the count of a counter and for converting the digital value stored in the counter to an analog value. Similarly, the digital system can be constructed utilizing a digital processor system. Various arrangements can also be employed to provide alarm indications or to modify operation of the electric load system when the battery voltage is discharged to predetermined levels.

The preferred embodiment utilizes no-load discharge means providing a modified discharge rate during intervals when there is no battery discharge current. Since the state-of-charge indicator incorporates no means for direct detection of discharge current, there is a need for an alternate means for detecting no-load, i.e. no discharge current, conditions. In some applications, this may be provided by monitoring the state of line contactors or other elements which interrupt the connection between the battery and the load circuit. However, in motor applications, such as electric traction motors, the no-load indication can be obtained from a simple self-contained unit which requires no external connection other than connection to the battery circuit, e.g. the terminals of the battery being monitored. It has been found that a low voltage ripple of relatively high frequency is present at the battery terminals during operation of the motor due to commutation in the motor. A no-load monitor can thus be incorporated into the state-of-charge indicating system to provide the necessary no-load indication.

Figure 5:
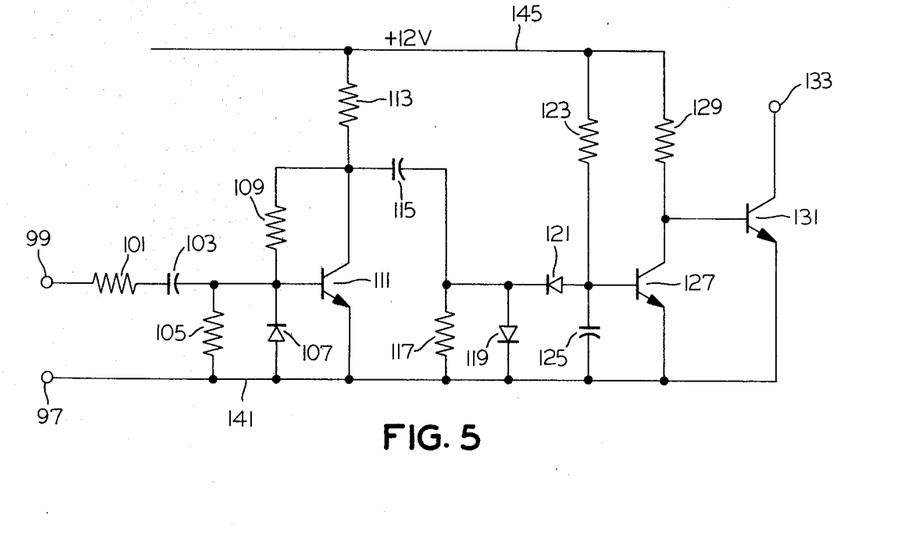
FIG. 5 is a schematic drawing of an open circuit sensor circuit which is suitable for use with the embodiments of FIG. 2 and of FIG. 4.

FIG. 5 illustrates such a no-load detector which monitors the presence or absence of commutator voltage ripple and thus provides an output indicative of the presence or absence of battery discharge current. Terminals 99 and 97 are respectively connected to the battery, such that, for example, the positive battery terminal is connected to 99 and the negative terminal is connected to terminal 97 and common bus 141. Resistor 101 and coupling capacitor 103 are connected serially between terminal 99 and the base of transistor 111. The emitter of the transistor is connected to the common bus and the collector is connected through resistor 113 to positive bus 145, e.g. +12 volts. Feedback biasing resistor 109 is connected from the collector to the base. Resistor 105 and negative clamping diode 107 are connected in parallel between the base and the emitter. The transistor circuit thus operates as an AC amplifier producing an amplified ripple signal at the collector.

Capacitor 115 and diode 121 are connected serially between the collector of transistor 111 to the base of transistor 127, whose emitter is connected to the common bus. Resistor 117 and diode 119 are connected in parallel from the junction of capacitor 115 and diode 121 to the common bus. The collector of transistor 127 is connected via resistor 129 to positive bus 145, and its base is connected via biasing resistor 123 to bus 145. The collector device 127 is connected to the base of transistor 131, whose emitter is connected to the common bus and whose collector is connected to terminal 133, which constitutes the output of the no-load detector.

The amplified ripple signal appearing at the collector of transistor 111 is coupled by capacitor 115 to load resistor 117 and a peak detector circuit comprising diode 121 and capacitor 125. Diode 119 isolates the peak circuit from positive voltage excursions such that the upper plate of capacitor 125 is driven negative in respect to the common bus when ripple voltage is present at input terminal 99.

Transistor 127 is normally biased in the on state by bias resistor 123 so as to have a low collector voltage. Transistor 131 is therefore normally cut off. Thus, when there is no ripple, i.e. no discharge current, transistor 131 being cut off has a high impedance. Accordingly, terminal 133 presents a high impedance.

During the presence of ripple, the negative potential on the top plate of capacitor 125, i.e. the capacitor terminal connected to the base of transistor 127, provides sufficient reverse bias to overcome the positive bias supplied to the base by resistor 123. Accordingly, transistor 127 is cut off during intervals of ripple. When transistor 127 is cut off, its collector voltage rises sufficiently to turn on transistor 131. Thus, during intervals when there is ripple current, i.e. battery discharge current, conduction of transistor 131 causes terminal 133 to have a low impedance path to the common bus 141. Terminal 133 thus constitutes a high impedance when there is no battery discharge current and a low, i.e. zero, impedance to common bus 141 when there is discharge current. Terminal 133 can thus be directly connected to terminal 51 of the circuit illustrated in FIG. 4 in order to control operation of the no-load discharge means.

While preferred forms of the invention have been herein shown and described by way of illustration, modifications and variations thereof will probably occur to persons skilled in the art. It is therefore intended by the concluding claims to cover all such changes and modifications as fall withint he true spirit and scope of this invention.

What is claimed as new and desired to be secured by Letters Patent of the United States is:

1. A circuit for monitoring the charge state of a battery supplying discharge current to its normal load circuit under actual load operation during which battery discharge current is subject to magnitude variations and interruptions comprising:
   (a) battery terminal voltage sensing means adapted to provide a scaled battery voltage signal representative of actual battery terminal voltage;
   (b) storage means for storing a stored signal whose value is indicative of the state-of-charge of said battery, said stored signal having predetermined first and second values representative of battery terminal voltage under no-load conditions, said first and said second values being representative, respectively, of the fully charged and discharged battery;
   (c) means for coupling said sensing means and storage means solely to increase the value of said stored signal at a rapid first rate to the scaled value of said battery voltage signal during intervals when the scaled value of said battery voltage signal exceeds the value of said stored signal;
   (d) means for continuously decreasing the value of said stored signal at a slow second rate, said second rate being pre-established to provide for variation of said stored signal from said first value to said second value in a time period approximating the average time required for the fully charged battery to become discharged during normal operation of the load circuit; and
   (e) means responsive to the value of said stored signal for providing an indication of battery state-of-charge, whereby said circuit is operative under conditions of variable battery discharge current and without sensing the magnitude of battery discharge current.

2. The circuit of claim 1, wherein the means for decreasing the stored signal has a pre-established rate providing for variation from said first to said second value in a time period exceeding 30 minutes.

3. The circuit of claim 1, wherein said means for coupling said sensing means and storage means comprises comparison means for comparing the scaled values of said battery voltage and stored signals and means, responsive to said battery voltage signal exceeding said stored signal for increasing the value of said stored signal to the scaled value of said battery voltage signal.

4. The circuit of claim 2 wherein said storage means comprises capacitance means, coupled to be charged by the output of said comparison means.

5. The circuit of claim 4 wherein said means for continuously decreasing the value of said stored signal comprises constant current discharge means coupled in circuit with said capacitance means.

6. The circuit of claim 5 wherein said constant current discharge means comprises resistance means coupled in parallel circuit with said capacitance means, and means for establishing a constant potential across at least a portion of said resistance means to establish a discharge current of predetermined amplitude.

7. The circuit of claim 1 comprising additional means for decreasing the value of said stored signal at a third rate intermediate said first and second rates solely during intervals during which the battery provides no discharge current to the load circuit.

8. The circuit of claim 7 comprising means detecting the presence of battery discharge current for inhibiting said additional means during intervals of battery discharge current.

9. The circuit of claim 8 wherein said third rate is selected such that upon cessation of discharge current, the time interval required for the stored signal to attain the scaled value of said battery voltage signal approximates the time interval required for the battery terminal voltage to attain its no-load value.

10. A circuit adapted for monitoring the charge state of a battery supplying discharge current to its normal load circuit under actual load operation during which the battery discharge current is subject to magnitude variation and interruption, comprising:
(a) a battery terminal voltage sensing means adapted to provide a scaled battery voltage signal;
(b) storage means for storing a stored signal whose value is indicative of the state-of-charge of said battery;
(c) first means for increasing the value of said stored signal to the scaled value of said battery voltage signal at a rapid first rate;
(d) second means for decreasing the value of said stored signal at a slow second rate during intervals of battery discharge current;
(e) third means for decreasing the value of said stored signal at a third rate intermediate said first and second rates during intervals when battery discharge current is interrupted; and
(f) means for utilizing said stored signal to provide an indication representative of the charge state of the battery.

11. The circuit of claim 10, wherein said first means are connected to increase the value of said stored signal solely during intervals when the scaled value of said battery voltage signal exceeds the value of said stored signal.

12. The circuit of claim 11, comprising fourth means for inhibiting operation of said third means during intervals when there is battery discharge current.

13. The circuit of claim 12 for use with an electric motor load circuit, wherein said fourth means comprises means for detection of voltage ripple signals resulting from operation of an electric motor load, and means responsive to detection of such ripple signals for inhibiting operation of said third means.

14. The circuit of claim 10, wherein said second means is constructed to decrease the value of said stored signal at a predetermined rate established such that said stored signal is decreased from a first value representative of the no-load voltage of a fully charged battery to a second voltage representative of no-load voltage of a discharged battery in a time period approximating the average time required for the fully charged battery to become discharged during normal operation of the load circuit.

15. The circuit of claim 14, wherein said third means is constructed such that the value of said stored signal is decreased at a third rate selected such that upon cessation of discharge current the time interval for the stored signal to attain the scaled value of said battery voltage approximates the time interval required for the battery terminal voltage to attain its no-load value.

16. A circuit adapted for monitoring the charge state of a battery supplying discharge current to its normal load under actual load operation during which the battery discharge current is subject to magnitude variation and interruption, comprising:
(a) means for sensing battery terminal voltage to provide a scaled battery voltage signal;
(b) capacitance means for storing a stored signal whose value is indicative of the state-of-charge of said battery;
(c) comparison means for comparing the scaled values of said battery voltage signal and said stored signal, said comparison means comprising an output coupled via unilaterally conducting means to said capacitance means for increasing the value of said stored signal to the scaled value of said battery voltage during intervals when the scaled value of said battery voltage signal exceeds the value of said stored signal;
(d) constant current discharge means coupled in circuit with said capacitance means for continuously decreasing the value of said stored signal at a predetermined slow rate;
(e) additional discharge means coupled in circuit with said capacitance means for decreasing the value of said stored signal at a rate faster than said predetermined slow rate; and
(f) means for sensing the presence of battery discharge current and responsive thereto inhibiting operation of said additional discharge means.

* * * * *